United States Patent
Lukanc et al.

(10) Patent No.: US 7,108,946 B1
(45) Date of Patent: Sep. 19, 2006

(54) METHOD OF LITHOGRAPHIC IMAGE ALIGNMENT FOR USE WITH A DUAL MASK EXPOSURE TECHNIQUE

(75) Inventors: Todd P. Lukanc, San Jose, CA (US); Sarah N. McGowan, San Francisco, CA (US); Bhanwar Singh, Morgan Hill, CA (US); Joerg Reiss, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 457 days.

(21) Appl. No.: 10/755,664

(22) Filed: Jan. 12, 2004

(51) Int. Cl.
*G03F 9/00* (2006.01)
*G03C 5/00* (2006.01)
(52) U.S. Cl. .......................... 430/22; 430/30; 430/312
(58) Field of Classification Search ................ 430/22, 430/30, 312
See application file for complete search history.

(56) References Cited

U.S. PATENT DOCUMENTS

| 5,563,012 A | * | 10/1996 | Neisser ........................ 430/22 |
| 6,139,995 A | * | 10/2000 | Burm et al. ................... 430/22 |
| 6,269,322 B1 | | 7/2001 | Templeton et al. |
| 6,420,224 B1 | | 7/2002 | Kajita et al. |
| 6,552,790 B1 | | 4/2003 | Templeton et al. |
| 2003/0064307 A1 | * | 4/2003 | Nakamura et al. ............ 430/22 |

* cited by examiner

*Primary Examiner*—Christopher G. Young
(74) *Attorney, Agent, or Firm*—Renner, Otto, Boisselle & Sklar LLP

(57) ABSTRACT

Methods of fabricating an integrated circuit on a wafer using dual mask exposure lithography is disclosed. Improved mask image alignment between a first mask image and a second mask image of a dual mask exposure technique can be achieved by aligning the second mask image to a latent image created by an exposure using the first mask image.

15 Claims, 2 Drawing Sheets

METHOD OF LITHOGRAPHIC IMAGE ALIGNMENT FOR USE WITH A DUAL MASK EXPOSURE TECHNIQUE

TECHNICAL FIELD

The present invention relates generally to the field of integrated circuit manufacture and, more particularly, to a method of lithographic image alignment for use with a dual mask exposure technique.

BACKGROUND

The formation of various integrated circuit (IC) structures on a wafer often relies on lithographic processes, sometimes referred to as photolithography, or simply lithography. For instance, patterns can be formed from a photo resist layer by passing light energy through a mask (or reticle) having an arrangement to image the desired pattern onto the photo resist layer. As a result, the pattern is transferred to the photo resist layer. In areas where the photo resist is sufficiently exposed and after a development cycle, the photo resist material can become soluble such that it can be removed to selectively expose an underlying layer (e.g., a semiconductor layer, a metal or metal containing layer, a dielectric layer, etc.). Portions of the photo resist layer not exposed to a threshold amount of light energy will not be removed and serve to protect the underlying layer. The exposed portions of the underlying layer can then be etched (e.g., by using a chemical wet etch or a dry reactive ion etch (RIE)) such that the pattern formed from the photo resist layer is transferred to the underlying layer. Alternatively, the photo resist layer can be used to block dopant implantation into the protected portions of the underlying layer or to retard reaction of the protected portions of the underlying layer. Thereafter, the remaining portions of the photo resist layer can be removed.

There is a pervasive trend in the art of IC fabrication to increase the density with which various structures are arranged. As a result, there is a corresponding need to increase the resolution capability of lithography systems. Various resolution enhancement techniques (RET) have been proposed to aid in the lithography process. For example, alternating phase shift masks and full phase shift masks have been employed. As another example, dipole illumination sources have been used.

In conjunction with these resolution enhancement techniques dual mask exposures have been used. An example dual mask exposure can involve exposing a photo resist layer with a first mask of a mask pair and then separately exposing the same photo resist layer with a second mask of the mask pair. Variations to this basic dual mask exposure technique exist and will be discussed in greater detail in subsequent sections.

Conventionally, integrated circuit fabrication involves exposing the wafer to multiple mask images. To achieve an acceptable overlay among the physical layers having patterns defined by these mask images, alignment of each mask within a given tolerance should be achieved. As is known in the art, overlay relates the lateral positioning between physical layers comprising an integrated circuit. If the layers are not properly aligned with each other, the performance of the devices of the integrated circuit can be compromised. In this situation, it is likely that the integrated circuit, if not the entire wafer (upon which multiple integrated circuits may be fabricated), may be unusable.

In conventional wafer processing mask image alignment is achieved by establishing a zero mark on the wafer. Typically, the zero mark is the first structure printed onto the wafer. The zero mark can be carefully optimized to provide a reference point to which each exposure (e.g., all mask images) are aligned. It is noted that some physical layers (e.g., a metal layer) may adversely impact the use of the zero mark for subsequent mask images and, in this situation, a new zero mark can be established on the wafer for use in aligning subsequent mask images.

Conventionally, each mask image of a dual mask exposure is aligned to the zero mark. In some situations, this method of mask image alignment does not result in satisfactory alignment between the first mask image and the second mask image of the dual mask exposure.

Accordingly, there exists a need in the art for techniques of improving alignment in dual mask exposures.

SUMMARY OF THE INVENTION

According to one aspect of the invention, the invention is directed to a method of fabricating an integrated circuit on a wafer using dual mask exposure lithography. The method can include forming a photo resist layer over the wafer; aligning the wafer with respect to a lithography system using a reference mark that is formed on the wafer; exposing the photo resist layer with a first mask image defined by a first mask using the lithography system, the first mask image including a latent image alignment mark that is transferred to the photo resist layer; re-aligning the wafer with respect to the lithography system using the latent image alignment mark resulting from the exposure to the first mask image; and exposing the photo resist layer with a second mask image defined by a second mask using the lithography system.

According to another aspect of the invention, the invention is direction to a method of fabricating a hard mask layer on a wafer using dual mask exposure lithography. The method can include forming a first photo resist layer over a layer of hard mask material that is formed over the wafer; aligning the wafer with respect to a lithography system using a reference mark that is formed on the wafer; exposing the first photo resist layer with a first mask image defined by a first mask using the lithography system, the first mask image including a latent image alignment mark that is transferred to the photo resist layer; developing the first photo resist layer; etching the hard mask material layer to transfer a layout of the first mask image to the hard mask material layer, the transferred layout including the latent image alignment mark; re-aligning the wafer with respect to the lithography system using the latent image alignment mark; and exposing wafer with a second mask image defined by a second mask using the lithography system.

BRIEF DESCRIPTION OF DRAWINGS

These and further features of the present invention will be apparent with reference to the following description and drawings, wherein.

DISCLOSURE OF INVENTION

Figure 1:
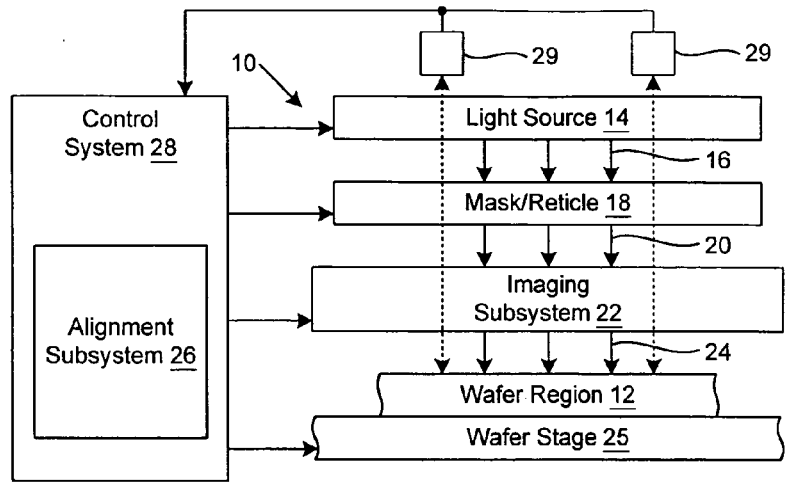
FIG. 1 is a schematic block diagram of an example integrated circuit processing arrangement.

In the detailed description that follows, similar components have been given the same reference numerals, regardless of whether they are shown in different views and/or embodiments. To illustrate the various aspects of the present invention(s) in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

The description herein is presented in the exemplary context of fabricating a wafer having an integrated circuit (IC) formed thereon. Example ICs include general purpose microprocessors made from thousands or millions of transistors, a flash memory array or any other dedicated circuitry. One skilled in the art will appreciate that the methods and devices described herein can also be applied to the fabrication of any article manufactured using lithography, such as micromachines, disk drive heads, gene chips, micro electromechanical systems (MEMS) and so forth.

The apparatus and methods described herein can provide for improving mask image alignment between a first mask image and a second mask image of a dual mask exposure technique. Briefly, alignment can be improved by aligning the second mask image to a latent image created by an exposure using the first mask image. As should be appreciated, the terms reticle or photomask may be used interchangeably with the term mask.

The term mask image will be used to refer to the illuminated pattern incident on the wafer resulting from an exposure of the wafer using a particular mask. The term layer is sometimes used in the art to describe a mask image, but the term layer will be used herein to refer to a physical layer of material, such as a photo resist layer, a dielectric layer, a polysilicon layer, a source/drain layer, etc.

Dual mask exposure, as used herein, involves exposing a photo resist layer with a first mask image of a mask pair to generate a first mask image and then separately exposing the same photo resist layer with a second mask layer of the mask pair to generate a second mask image. As a result, the exposures using each of the masks (e.g., the first and second mask images) are embodied into the same physical layer of photo resist. As one skilled in the art will appreciate, variations to the foregoing basic dual mask exposure technique exist and should be considered to fall within the scope of the term "dual mask exposure." An example variation can include using an additional mask image or images applied to the photo resist material (e.g., a triple mask exposure or higher order mask exposure).

Another example variation to dual mask exposure includes partially or fully developing, or otherwise processing, the photo resist layer between exposures using the first dual exposure mask and the second dual exposure mask.

Another example variation includes the use of a stack of photo resist layers. Each mask image may be applied to all of the sublayers of the photo resist layer or any one of the mask images may be applied to less than all of the photo resist layers. In this variation, one or more photoresist layers may be deposited after a particular mask image is generated.

Yet another example variation includes defining the layout of a hard mask (e.g., a nitride layer formed over an underlying layer to be processed with the nitride layer as a protective mask layer for that underlying layer) using two or more mask images. For example, a first photo resist layer can be formed over the hard mask layer and exposed with the first mask image. The first photo resist layer can be developed and the hard mask layer can be processed in a desired manner. Thereafter, a second photo resist layer can be formed over the hard mask layer (the first photo resist layer optionally can be removed) and exposed with the second mask image. The second photo resist layer can be developed and the hard mask layer can be processed again. Thereafter, the underlying layer can be processed as desired using the hard mask to protect certain areas of the underlying layer.

Dual mask exposure techniques can be used in conjunction with various resolution enhancement techniques (RET) intended to increase the resolution capability of lithography systems. For example, the masks of the dual mask exposure may include alternating phase shift masks and/or full phase shift masks. As another example, a dipole illumination source may be used to provide radiation incident on the masks of the dual mask exposure.

Dual mask exposure techniques can be used in a variety of manners to enhance wafer processing and can include, for example, creating a composite mask image from the individual mask images of each mask in the dual mask exposure. For example, one mask image can be used to define critical dimension features and the other mask image can be used to define non-critical dimension features. As another example, one mask image can be used to define images in one direction (e.g., the X direction) and the other mask image can be used to define images in another direction (e.g., the Y direction). Dual mask exposures can be used in connection with the formation of a wide variety of wafer layers, including, but not limited to, a polysilicon layer, a source/drain layer and so forth.

Turning initially to FIG. 1, illustrated is a schematic block diagram of an exemplary integrated circuit processing arrangement that includes a lithography system 10 used to image a pattern onto a wafer 12, or a region thereof. The system 10 can be, for example, a step-and-repeat exposure system or a step-and-scan exposure system, but is not limited to these example systems. The system 10 can include a light source 14 for directing light energy 16 towards a mask 18 (sometimes referred to as a reticle). The light energy 16 can have, for example, a deep ultraviolet (DUV) wavelength (e.g., about 248 nm or about 193 nm), a vacuum ultraviolet (VUV) wavelength (e.g., about 157 nm), or an extreme ultraviolet (EUV) wavelength (e.g., about 13.4 nm).

The mask 18, which can be mounted on a stage or chuck (not shown) selectively blocks light energy 16 (or, in the case of an EUV wavelength, selectively reflects radiation) such that a light energy pattern 20 defined by the mask 18 is transferred towards the wafer 12. An imaging subsystem 22, such as a stepper assembly or a scanner assembly, sequentially directs the energy pattern 20 transmitted by the mask 18 to a series of desired locations on the wafer 12. The imaging subsystem 22 may include a series of lenses and/or reflectors for use in scaling and directing the energy pattern 20 towards the wafer 12 in the form of an imaging (or exposure) light energy pattern 24.

The wafer 12 may be mounted on a wafer stage 25. In one embodiment, the wafer stage 25 can be moved relative to the imaging subsystem 22 so as to place a desired portion of the wafer 12 in the path of the exposure pattern 24. Alternatively, the imaging optics can be movable and/or the exposure pattern can be optically retargeted. As will be discussed in greater detail below, between each sequential illumination of the wafer 12 with the exposure pattern 24, alignment of the exposure pattern 24 and the wafer 12 can be established with the use of reference marks (sometimes referred to as scribe marks if the reference marks are placed in scribe lines of the wafer).

To assist in aligning the wafer 12 with respect to the exposure pattern, the lithography system 10 can include an alignment subsystem 26. The alignment subsystem 26 may be a part of a general control system 28 for the lithography system 26. Wafer alignment subsystems are relatively well known in the art and, therefore, the details of such systems are described only briefly and/or omitted. In one example, the alignment subsystem 26 includes wafer alignment sensors 29, sometimes referred to as microscopes. The alignment sensors 29 can have an optic axis parallel to (e.g., off axis) or coincident with (e.g., axial) the optic axis of the imaging subsystem 22. Each alignment sensor 29 can image a laser light spot (not shown) onto the wafer 12, for example. The laser spot is radiation of a wavelength that should not activate the photosensitive agent (photo resist material) that is disposed on the wafer 12. Also, each alignment sensor 29 can have a photo-element (not shown) for receiving scattered light and/or diffracted light from the reference marks printed on the wafer 12. The alignment sensors 29 can each include systems for synchronizing and rectifying the photoelectric signal output by the photo-elements, respectively, at the vibration period of the light spot(s) and for outputting an alignment signal corresponding to alignment mark deviation relative to the center of vibration of the light spot(s). It is to be appreciated that wafer alignment positioning systems are evolving rapidly and any suitable alternative positioning system (e.g., a through the lens system) may be employed.

Figure 2:
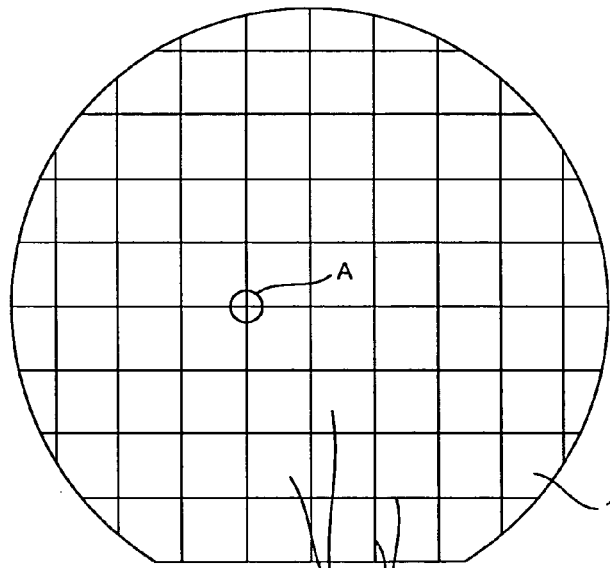
FIG. 2 is a top view of an example semiconductor wafer that can be processed using the integrated circuit processing arrangement of FIG. 1.

Turning now to FIG. 2, a top view of an example semiconductor wafer 12 that can be processed using the lithography system 10 is shown. The wafer 12 comprises a plurality of die regions 30 that are delineated on the wafer by scribe lines 32.

Figure 3:
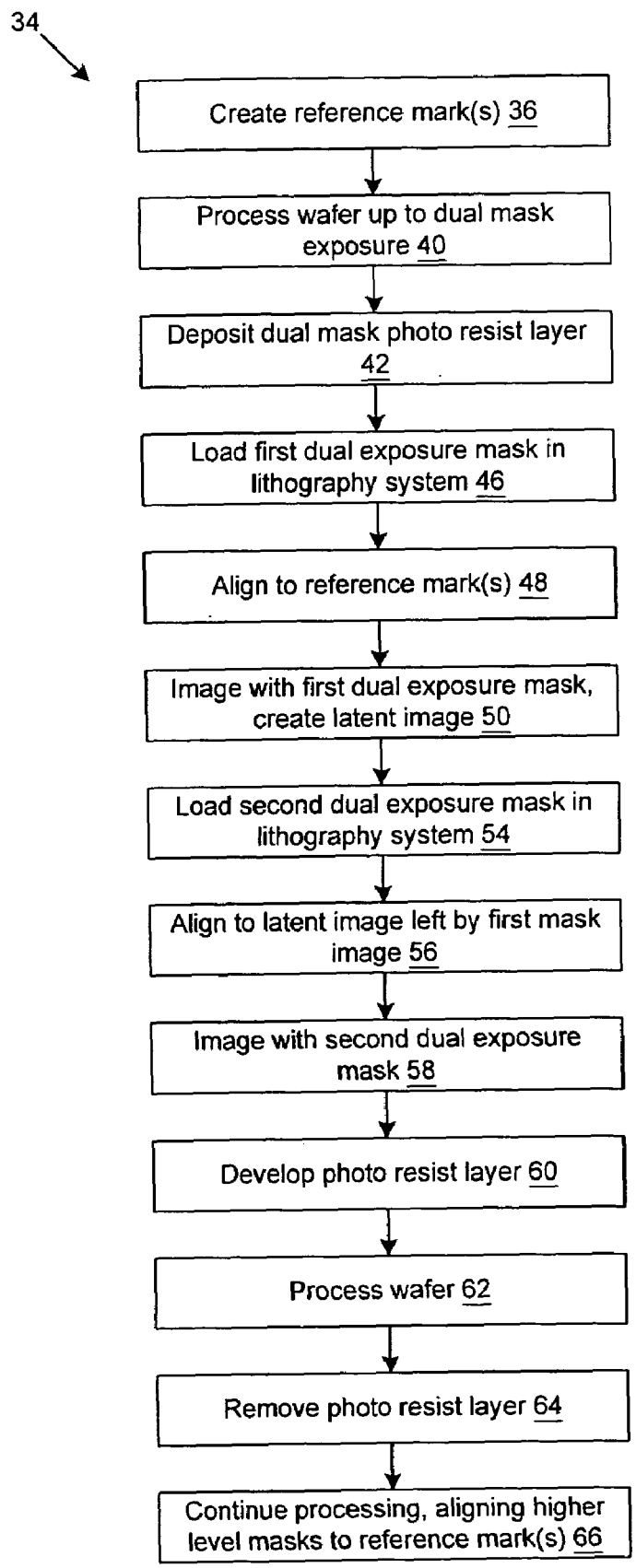
FIG. 3 is a flow diagram of an example technique for aligning mask images of a dual mask exposure.

With additional reference to FIG. 3, a flow diagram of an example technique, or process 34, for aligning mask images of a dual mask exposure is shown. The process 34 can be thought of as depicting steps in a method. The flow diagram includes a number of process blocks arranged in a particular order. Since lithographic processing and dual mask exposure techniques in particular, can vary widely, the illustrated process 34 is merely exemplary. As should be appreciated, many alternatives and equivalents to the illustrated process 34 may exist and such alternatives and equivalents are intended to fall with the scope of the claims appended hereto. Alternatives may involve carrying out additional steps or actions not specifically recited and/or shown, carrying out steps or actions in a different order from that recited and/or shown, and/or omitting recited and/or shown steps. Alternatives also include carrying out steps or actions concurrently or with partial concurrence.

As should as be apparent, the process 34 is described for a dual mask exposure of a particular die area 30, or other region of the wafer 12, to be exposed by a corresponding pair of mask images (e.g., a second mask image exposed onto the same area as was previously exposed by a first mask image). Between certain processing steps described herein, the wafer 12 may be moved to expose other areas of the wafer 12 (e.g., following a step and repeat technique or scan and repeat technique) or to process the wafer 12 (e.g., to partially develop photo resist material).

Figures 4, 5:
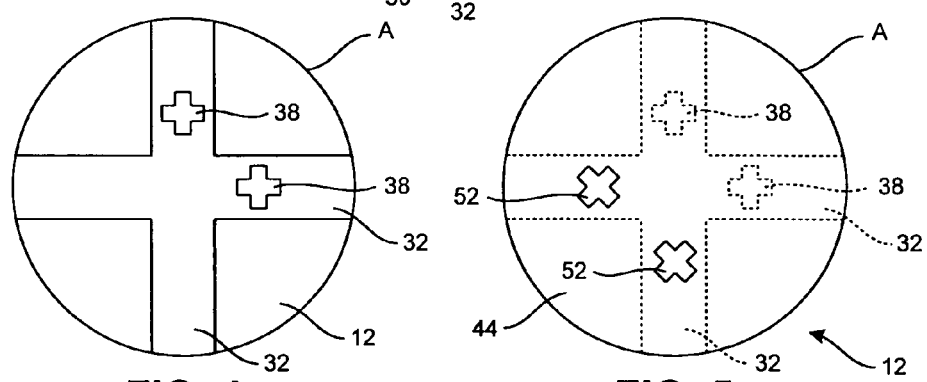
FIG. 4 is an enlarged partial top view of the wafer of FIG. 2 in an intermediate stage of integrated circuit fabrication.
FIG. 5 is an enlarged partial top view of the wafer of FIG. 2 in another intermediate stage of integrated circuit fabrication.

With additional reference to FIG. 4, the process 34 can begin in block 36 where reference marks 38 are created on the wafer 12. FIG. 4 is an enlarged partial top view of a portion of the wafer 12 identified by circle A of FIG. 2. The creation of reference marks 38 are relatively well know in the art and will not be described in great detail. In the illustrated example, the reference marks 38 are disposed within the sacrificial scribe areas 32 of the wafer 12 (e.g., where the wafer 12 will be sawed apart to obtain individual integrated circuit chips from the wafer 12) and can be referred to as scribe marks. The reference marks 38 can include zero marks (e.g., marks that are among the first structures printed on the wafer) or marks associated with a current process. Also, the reference marks 38 need not be formed in the scribe lines 32 and can be formed within the die regions 30.

The reference marks 38 can serve as alignment reference points that are used by the alignment subsystem 26 to position the wafer 12 relative to the exposure pattern 24 before various exposures of the wafer 12, with the exception of certain dual mask exposures as described in greater detail below.

Following formation of the reference marks 38, the wafer 12 can be processed up to the point that a dual mask exposure is desired. The processing may include configuring the wafer 12 for the formation of bulk type devices or semiconductor-on-insulator (SOI) devices (e.g., having a semiconductor layer formed over an insulating layer such as a buried oxide layer that is, in turn, formed over a handle wafer). Example processing in block 40 can include forming various layers (including patterned and unpatterned layers), forming isolation regions, forming structures and/or implanting various regions. As one skilled in the art will appreciate, the processing of block 40 can differ greatly depending on the specific devices being formed on the wafer 12.

During the processing of block 40, it is contemplated that lithographic patterning of one or more photo resist layers may be employed (e.g., the layers of photo resist corresponding to a physical layer of the wafer to be etched, implanted or otherwise processed). Each layer of photo resist can be exposed to an exposure pattern 24. In preparation for the exposure, the wafer 12 can be aligned to the imaging subsystem 22 using the reference marks 38 as reference points.

Once the wafer 12 has been processed up to the point where a dual mask exposure is desired, a dual mask photo resist layer can be deposited on the wafer 12 in block 42. With additional reference to FIG. 5, shown is an enlarged partial top view of the wafer 12 with a dual mask photo resist layer, or photo resist layer 44, formed thereon. FIG. 5 is an enlarged partial top view of a portion of the wafer 12 identified by circle A of FIG. 2. If desired, block 42 can include additional depositions and/or processing associated with the photo resist layer 44. For example, a primer and/or bottom anti-reflective coating (BARC) layer can be formed over the wafer 12 prior to photo resist layer 44 deposition and/or a coating or treatment can be applied over the photo resist layer 44.

In block 46 a first mask for imaging the wafer 12 as part of the dual mask exposure can be loaded into the lithography system 10. Thereafter, the wafer 12 can be aligned with respect to the imaging subsystem 22 in block 48. In one embodiment, the alignment of block 48 is made using the reference marks 38.

After the wafer 12 has been aligned, the process 34 can continue in block 50 where the photo resist layer 44 is imaged using the first mask to define the exposure pattern 24. The exposure pattern 24 defined by the first mask can be considered a first mask image.

Portions of the first mask image can be used to define one or more latent images 52 in the photo resist layer 44. As will be discussed below, the latent images 52 can be used to assist in aligning the wafer 12 in preparation for an exposure using a second mask of the dual mask exposure. In the illustrated embodiment, the latent images 52 are formed in the areas defined by the scribe lines 32. Therefore, the latent images 52 can be considered a category of reference marks or scribe marks. The latent images 52 need not be formed in the scribe lines 32 and can be formed within the die regions 30.

The alignment sensors 29 of the alignment subsystem 26 can be configured to detect the latent images 52. In one embodiment, two sets of alignment sensors 29 can be provided such that one set is used when aligning the wafer 12 to the reference marks 38 and the other set is used when aligning to the latent images 52.

In many situations, merely exposing conventional photo resist material to an exposure dose may not result in latent images that are detectable (e.g., can be "seen") by the alignment sensors 29. Accordingly, enhancements to the photo resist layer 44 can be made and/or processing of the exposure photo resist layer 44 can be carried out to enhance detectability of the latent images 52 by the alignment sensors 29. The enhancements and/or processing are selected to result in changes in optical characteristics of the photo resist layer 52 that can be detected by the alignment subsystem 26. These changes in optical characteristics can include, for example, changing an amount of reflected light energy associated with the latent image 52, defining an edge or other geometrical boundary associated with the layer image 52 and so forth.

An example technique for enhancing detectability of the latent images 52 can include adding compounds to the photo resist layer 44 during formation in block 42 to alter the resist chemistry. When the photo resist layer 44 is exposed to the first mask image, the altered resist chemistry can change appearance in the locations upon which a threshold amount of energy is incident. The appearance change need only be detectable by the alignment subsystem 26, and specifically the alignment sensors 29 (FIG. 1).

Another example technique for enhancing detectability includes using a photo resist layer 44 comprised of two or more sublayers. The first mask image can be used to pattern a top resist layer with a desired pattern that includes the latent images 52. The other sublayer(s) may also be exposed to the first mask image. Thereafter, the top resist layer(s) can be developed or partially developed to create an edge or edges defining the latent images 52 that are detectable by the alignment subsystem 26. In one embodiment, each resist sublayer optionally may have different characteristics that allow for development or partial development of a top resist sublayer, such as wavelength sensitivity, exposure dose sensitivity, thicknesses, developer solubility, etc. In another embodiment, the top layer(s) are optimized to leave detectable latent images 52 by exposure only. After development of the photo resist layer 44, images from both mask images can then be realized.

As one skilled in the art will appreciate, the techniques for enhancing latent image detectability are not limited to those specifically identified herein. For example, other known techniques exist for creating an image in a photo resist layer without completely developing the photo resist layer can be used.

The process 34 can continue in block 54 where a second mask for imaging the wafer 12 as part of the dual mask exposure can be loaded into the lithography system 10.

Thereafter, in block 56 the wafer 12 can be aligned with respect to the imaging subsystem 22 in preparation for exposing the photo resist layer 44 with a second mask image as defined by the second mask. The second mask image corresponds to the first mask image so as to constitute a dual mask exposure. The alignment of block 56 is made using the latent images 52, the locations of which were defined by the first mask image.

Next, in block 58, the photo resist layer 44 is imaged using the second mask to define an exposure pattern, or second mask image. Following exposure by the second mask image, the photo resist layer 44 can be developed in block 60. The developed photo resist layer 44 can include a layout defined by both the first and second mask images. This layout of the developed photo resist layer 44 can be used in connection with additional processing of the wafer 12 in block 62. The processing of the wafer 12 can include processing a layer that underlies the photo resist layer 44. For example, the underlying layer can be etched such that the layout of the photo resist layer 44 is transferred to the underlying layer. In other examples, the photo resist layer 44 can be used to selectively block dopant implantation into the underlying layer or to selectively retard reaction of the underlying layer with a reagent.

After the photo resist layer 44 is no longer desired; the photo resist layer 44 can be removed in block 64. Removal techniques, such as dry ashing, are relatively well known in the art and will not be discussed in greater detail.

Processing of the wafer 12 can continue in block 66. The processing of block 66 can include depositing and/or patterning additional photo resist layers on the wafer 12. The additional photo resist layers can be patterned using lithographic techniques where alignment of the wafer 12 with respect to the imaging subsystem 22 is made by tracking the location of the reference marks 38.

The example process 34 as described above generally relates to a basic dual mask exposure technique. One with ordinary skill in the art will appreciate that the process 34 can be appropriately modified to accommodate the wide variety of variations that fall within the scope of dual mask exposures.

As an example modification, detectability of the latent images 52 can be enhanced by increasing their exposure. For example, the latent images 52 can be exposed twice with the first mask. In another example, the latent images 52 can be exposed with the first mask and then again with an overlapping exposure.

As another example modification, a hard mask can be formed using the techniques described herein. In one embodiment, a first photo resist layer can be formed over a layer of hard mask material that is, in turn, formed over the wafer. The wafer can be aligned with respect to a lithography system using a reference mark that is formed on the wafer. Thereafter, the first photo resist layer can be exposed with a first mask image defined by a first mask using the lithography system. The first mask image can include a latent image alignment mark that is transferred to the photo resist layer. Then, the first photo resist layer can be developed and the hard mask material layer can be etched to transfer a layout of the first mask image to the hard mask material layer. The transferred layout can include the latent image alignment mark. Thereafter, the wafer can be realigned with respect to the lithography system using the latent image alignment mark and the wafer can be exposed with a second mask image defined by a second mask using the lithography system.

Additional processing for making the hard mask layer can include developing the photo resist and etching the hard mask material layer to transfer a layout of the second mask image to the hard mask material layer. Other processing can include forming a second photo resist layer over the layer of hard mask material after etching of the hard mask material layer to transfer the layout of the first mask image to the hard mask material and/or removing the first photo resist layer before forming the second photo resist layer.

In the illustrated embodiments, the reference marks 38 have a plus sign (e.g., "+") shape and the latent images 52 have an "x" shape. The shape of reference marks 38 and/or latent images 52 can differ from those illustrated. For example, the latent images 38 can be patterned in the shape of a plus ("+") sign similar to the illustrated reference marks 38, rather than in the illustrated "x" shape. Other shapes can also be used for either or both of the reference marks 38 and the latent images 52, including, for example, a square, a rectangle, a dash (e.g., "–"), and so forth.

The dual mask exposure technique described herein can result in less alignment error between the first mask image and the second mask image than found in prior art techniques. In convention techniques, alignment error between the first mask image and the second mask image can be at a maximum when the first mask image is aligned to a maximum tolerable alignment error with respect to the reference mark 38 in a first direction and the second mask image is aligned to the maximum tolerable alignment error with respect to the reference mark 38 in a second direction opposite that from the first direction. Statistically, this theoretical maximum alignment error rarely occurs and the alignment error between the first and second mask images can be computed using a root sum squared approach (e.g., sum the square of each image's alignment error and take the square root of the total). In an example where it is assumed that the maximum tolerable alignment error for a particular mask image with respect to the alignment reference is 50 nanometers (nm), the theoretical maximum alignment error will be 100 nm (e.g., 50 nm in opposite directions from the reference mark 38) and the statistical maximum alignment error will be about 70 nm (e.g., the square root of the total of 50 nm squared plus 50 nm squared).

Without intending to be bound by theory; the alignment error using the dual mask exposure technique described herein should be less than the conventional theoretical or statistical results. In the dual mask exposure technique described herein, alignment error with respect to the reference mark 38 for the first mask image does not factor as being a part of the alignment error between the first mask image and the second mask image. The second mask image is aligned to an image created by the first mask image (e.g., the latent image 52). Accordingly, the alignment error between the first mask image and the second mask image is simply the alignment error of the second mask image with respect to the alignment reference for the second mask image, which is the latent image 52 defined by the first mask image. In the example where it is assumed that the maximum tolerable alignment error for a particular mask image with respect to the alignment reference is 50 nm, the maximum alignment error between the first mask image and the second mask image should be no greater than 50 nm.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of fabricating an integrated circuit on a wafer using dual mask exposure lithography, comprising:
   forming a photo resist layer over the wafer;
   aligning the wafer with respect to a lithography system using a reference mark that is formed on the wafer;
   exposing the photo resist layer with a first mask image defined by a first mask using the lithography system, the first mask image including a latent image alignment mark that is transferred to the photo resist layer;
   re-aligning the wafer with respect to the lithography system using the latent image alignment mark resulting from the exposure to the first mask image;
   exposing the photo resist layer with a second mask image defined by a second mask using the lithography system; and
   enhancing detectability of the latent image alignment mark to an alignment sensor, wherein the enhancing includes developing a portion of the photo resist layer after exposure by the first mask image to establish a latent image alignment mark edge in the photo resist layer.

2. The method according to claim 1, further comprising developing the photo resist layer after exposure with both the first mask image and the second mask image.

3. The method according to claim 2, further comprising using the developed photo resist layer to protect a layer underlying the photo resist layer from at least one of etching, implantation and chemical reaction.

4. The method according to claim 1, wherein the lithography system is selected from a step-and-repeat lithography system, a step-and-scan system and combinations thereof.

5. The method according to claim 1, wherein the lithography system includes a first alignment sensor for tracking a location of the reference mark and a second alignment sensor for tracking a location of the latent image alignment mark.

6. The method according to claim 1, wherein the enhancing includes adding a compound to the photo resist layer during photo resist formation such that the photo resist layer changes appearance in locations exposed to a threshold amount of energy as defined by the first mask image.

7. The method according to claim 1, wherein the photo resist layer includes at least two sublayers and the developed portion of the photo resist layer includes a top layer of the sublayers.

8. The method according to claim 1, wherein the first mask image and the second mask image create a composite mask image on the photo resist layer.

9. A method of fabricating an integrated circuit on a wafer using dual mask exposure lithography, comprising:
   forming a photo resist layer over the wafer;
   aligning the wafer with respect to a lithography system using a reference mark that is formed on the wafer;
   exposing the photo resist layer with a first mask image defined by a first mask using the lithography system, the first mask image including a latent image alignment mark that is transferred to the photo resist layer;
   re-aligning the wafer with respect to the lithography system using the latent image alignment mark resulting from the exposure to the first mask image; and exposing the photo resist layer with a second mask image defined by a second mask using the lithography system;

wherein the photo resist layer includes at least two sublayers and exposure by the first mask image results in latent image alignment mark detectability in at least a top one of the sublayers.

10. A method of fabricating an integrated circuit on a wafer using dual mask exposure lithography, comprising:

forming a photo resist layer over the wafer;

aligning the wafer with respect to a lithography system using a reference mark that is formed on the wafer;

exposing the photo resist layer with a first mask image defined by a first mask using the lithography system, the first mask image including a latent image alignment mark that is transferred to the photo resist layer;

re-aligning the wafer with respect to the lithography system using the latent image alignment mark resulting from the exposure to the first mask image;

exposing the photo resist layer with a second mask image defined by a second mask using the lithography system; and enhancing detectability of the latent image alignment mark by increasing exposure of the latent image alignment mark with the first mask image.

11. The method according to claim 10, wherein increasing the exposure includes exposing at least twice with the first mask.

12. The method according to claim 10, wherein increasing the exposure includes exposing with an overlapping exposure.

13. A method of fabricating an integrated circuit on a wafer using dual mask exposure lithography, comprising:

forming a photo resist layer over the wafer;

aligning the wafer with respect to a lithography system using a reference mark that is formed on the wafer;

exposing the photo resist layer with a first mask image defined by a first mask using the lithography system, the first mask image including a latent image alignment mark that is transferred to the photo resist layer;

re-aligning the wafer with respect to the lithography system using the latent image alignment mark resulting from the exposure to the first mask image; and exposing the photo resist layer with a second mask image defined by a second mask using the lithography system;

wherein one of the first mask image and the second mask image defines critical dimension structures and the other of the first mask image and the second mask image defines non-critical dimension structures.

14. A method of fabricating an integrated circuit on a wafer using dual mask exposure lithography comprising:

forming a photo resist layer over the wafer;

aligning the wafer with respect to a lithography system using a reference mark that is formed on the wafer;

exposing the photo resist layer with a first mask image defined by a first mask using the lithography system, the first mask image including a latent image alignment mark that is transferred to the photo resist layer;

re-aligning the wafer with respect to the lithography system using the latent image alignment mark resulting from the exposure to the first mask image; and exposing the photo resist layer with a second mask image defined by a second mask using the lithography system;

wherein one of the first mask image and the second mask image defines edges in a first direction and the other of the first mask image and the second mask image defines edges in a second direction transverse to the first direction.

15. A method of fabricating an integrated circuit on a wafer using dual mask exposure lithography, comprising:

forming a photo resist layer over the wafer;

aligning the wafer with respect to a lithography system using a reference mark that is formed on the wafer;

exposing the photo resist layer with a first mask image defined by a first mask using the lithography system, the first mask image including a latent image alignment mark that is transferred to the photo resist layer;

re-aligning the wafer with respect to the lithography system using the latent image alignment mark resulting from the exposure to the first mask image;

exposing the photo resist layer with a second mask image defined by a second mask using the lithography system; and at least partially developing the photo resist layer between exposing with the first mask image and the second mask image.

* * * * *